(12) United States Patent
Matsumoto et al.

(10) Patent No.: US 9,372,223 B2
(45) Date of Patent: Jun. 21, 2016

(54) METHOD OF EVALUATING METAL CONTAMINATION IN SEMICONDUCTOR SAMPLE AND METHOD OF MANUFACTURING SEMICONDUCTOR SUBSTRATE

(75) Inventors: Kei Matsumoto, Hiroshima (JP); Ryuji Ohno, Saitama (JP)

(73) Assignee: SUMCO CORPORATION, Tokyo (JP)

( * ) Notice: Subject to any disclaimer, the term of this patent is extended or adjusted under 35 U.S.C. 154(b) by 197 days.

(21) Appl. No.: 14/123,866

(22) PCT Filed: Jun. 14, 2012

(86) PCT No.: PCT/JP2012/065200
§ 371 (c)(1),
(2), (4) Date: Dec. 4, 2013

(87) PCT Pub. No.: WO2012/173173
PCT Pub. Date: Dec. 20, 2012

(65) Prior Publication Data
US 2014/0097866 A1    Apr. 10, 2014

(30) Foreign Application Priority Data
Jun. 17, 2011   (JP) ................. 2011-135382

(51) Int. Cl.
*G01R 31/26* (2014.01)
*H01L 21/66* (2006.01)

(52) U.S. Cl.
CPC ............ *G01R 31/2632* (2013.01); *H01L 22/14* (2013.01); *H01L 2924/0002* (2013.01)

(58) Field of Classification Search
CPC ............ H01L 22/14; H01L 2924/0002; G01R 31/2632
USPC .................................................. 324/762.07
See application file for complete search history.

(56) References Cited

U.S. PATENT DOCUMENTS

| 3,859,585 A | 1/1975 | Meier |
| 4,437,060 A | 3/1984 | Ferenczi et al. |

(Continued)

FOREIGN PATENT DOCUMENTS

| HU | EP0041858 A1 * | 12/1981 | ......... G01R 31/2632 |
| JP | 59-046040 | 3/1984 | |

(Continued)

OTHER PUBLICATIONS

International Preliminary Report on Patentability for PCT/JP2012/065200, mail date is Dec. 17, 2013.

(Continued)

*Primary Examiner* — Benjamin M Baldridge
(74) *Attorney, Agent, or Firm* — Greenblum & Bernstein, P.L.C.

(57) ABSTRACT

An aspect of the present invention relates to a method of evaluating metal contamination in a semiconductor sample by DLTS method, which includes obtaining a first DLTS spectrum by measuring a DLTS signal while varying a temperature, the DLTS signal being generated by alternatively and cyclically applying to a semiconductor junction on a semiconductor sample a reverse voltage $V_R$ to form a depletion layer and a weak voltage $V_1$ to trap carriers in the depletion layer; obtaining a second DLTS spectrum by measuring a DLTS signal while varying a temperature, the DLTS signal is being generated by cyclically applying the $V_R$ to the semiconductor junction; obtaining a differential spectrum of the first DLTS spectrum with a correction-use spectrum in the form of the second DLTS spectrum or a spectrum that is obtained by approximating the second DLTS spectrum as a straight line or as a curve.

18 Claims, 9 Drawing Sheets

(56) References Cited

U.S. PATENT DOCUMENTS

| | | | | |
|---|---|---|---|---|
| 5,942,909 | A * | 8/1999 | Zhu | H01L 22/14 257/E21.531 |
| 8,346,497 | B2 * | 1/2013 | Miyairi | G01N 21/9501 382/149 |
| 2001/0016430 | A1 | 8/2001 | Nakano et al. | |
| 2002/0199141 | A1 * | 12/2002 | Lemlein | G01R 31/31937 714/724 |
| 2003/0001120 | A1 * | 1/2003 | Nishiyama | G01N 21/274 250/559.45 |
| 2005/0126471 | A1 * | 6/2005 | Jenny | C30B 23/00 117/92 |
| 2006/0028229 | A1 * | 2/2006 | Subramaniam | G01R 31/2894 324/759.01 |
| 2007/0001132 | A1 * | 1/2007 | Nishiyama | G01N 21/4738 250/559.4 |
| 2007/0117393 | A1 * | 5/2007 | Tregub | B24B 37/24 438/692 |
| 2007/0162800 | A1 * | 7/2007 | Tanaka | G01R 31/2831 714/724 |
| 2007/0201017 | A1 * | 8/2007 | Opsal | G01B 11/0641 356/237.2 |
| 2008/0020497 | A1 * | 1/2008 | Miyazaki | G01N 21/9501 438/14 |
| 2008/0262793 | A1 * | 10/2008 | Subramaniam | G01R 31/2894 702/179 |
| 2009/0222225 | A1 * | 9/2009 | Kojima | G01R 31/3008 702/64 |
| 2010/0022038 | A1 * | 1/2010 | Ohtsuki | H01L 22/14 438/17 |

FOREIGN PATENT DOCUMENTS

| | | |
|---|---|---|
| JP | 02-147972 | 6/1990 |
| JP | 03-042563 A | 2/1991 |
| JP | 2001-196431 | 7/2001 |
| JP | 2003-004785 | 1/2003 |
| KR | 10-2004-0063402 A | 7/2004 |

OTHER PUBLICATIONS

International Search Report in PCT/JP2012/065200, mail date is Aug. 14, 2012.

Korean Office Action in counterpart Korean Application No. 10-2014-7000237, dated Sep. 25, 2015 (with English-language translation).

Japanese Office Action for JP 2011-135382 mailed Sep. 24, 2014 and a partial English-language translation.

Korean Notice of Allowance in counterpart Korean Application No. 10-2014-7000237, dated Mar. 4, 2016.

\* cited by examiner

METHOD OF EVALUATING METAL CONTAMINATION IN SEMICONDUCTOR SAMPLE AND METHOD OF MANUFACTURING SEMICONDUCTOR SUBSTRATE

CROSS-REFERENCE TO RELATED APPLICATIONS

This application claims the benefit of priority to Japanese Patent Application No. 2011-135382 filed on Jun. 17, 2011, which is expressly incorporated herein by reference in its entirety.

TECHNICAL FIELD

The present invention relates to a method of evaluating metal contamination in a semiconductor sample, and more particularly, to a method of evaluating metal contamination permitting the evaluation of trace quantities of metal contaminants in semiconductor samples by the method of DLTS (Deep-Level Transient Spectroscopy).

The present invention further relates to a method of manufacturing a semiconductor substrate providing a product substrate in which quality has been controlled based on the results of evaluation by the above method.

BACKGROUND ART

Metal contamination of semiconductor substrates negatively affects device characteristics of the product. For example, when heavy metals such as Fe and Ni enter Si, they create deep levels in the band gap, function as carrier trap centers and Generation-Recombination Centers, cause p-n junction leaks in devices, and diminish the lifetime of silicon. Accordingly, a highly reliable method of evaluating metal contamination in semiconductor substrates is needed to provide high-quality semiconductor substrates with little metal contamination.

Various methods have been proposed and put to practical use as methods of evaluating metal contamination in semiconductor substrates. Of these, the DLTS method (see U.S. Pat. Nos. 3,859,585 and 4,437,060, which are expressly incorporated herein by reference in their entirety) has high sensitivity. As a result, it has frequently been used as silicon wafers have become increasingly clean, particularly in recent years.

A brief overview of the conventional DLTS method will be given below. The example of a sample in which a 1 mm² Schottky diode has been formed on p-type CZ silicon will be given with reference to the drawings below.

1) A reverse voltage ($V_R$) forming a depletion layer and a weak voltage ($V_1$) of close to 0 V to trap carriers in the depletion layer (the conditions under which the voltages are applied to the diode serving as the sample are shown in the top part of FIG. 12; in the figure, $V_R$=+5V and $V_1$=+1V) are alternatingly and cyclically applied to a semiconductor junction (Schottky junction or p-n junction) formed on a semiconductor sample to be evaluated.

2) The transient response of the capacitance of the diode that is generated in response to the voltage is measured (see the bottom part of FIG. 12).

3) The application of the voltage and the measurement of the capacitance in 1) and 2) above are conducted while varying the sample temperature over a prescribed temperature range. In the case of silicon, the temperature is generally varied over a range of 30 to 300K. The transient response of the capacitance is dependent on temperature. FIG. 13 shows a schematic diagram of such temperature dependence.

In this process, the DLTS signal ($\Delta C$) is defined as follows:

$$\Delta C = C(t1) - C(t2) \qquad (1)$$

In Equation (1) above, C(t1) denotes the capacitance at a time t1 after a prescribed period has elapsed following application of the voltage, and C(t2) denotes the capacitance at a time t2 after a prescribed period has elapsed following measurement of C(t1). In recent years, a method (lock-in type) has been widely used in which a lock-in amplifier is used to take the difference between the integrated values of the first half and second half of the transient response as the DLTS signal. Since the DLTS signal $\Delta C$ is a minute signal, the value $\Delta C$ that is measured is normally inputted to a computer and an average value is obtained for each temperature. However, there are many cases in which the temperature sweep is conducted linearly and the average value of $\Delta C$ obtained over a range of T±0.5 to 1 [K] is adopted as the $\Delta C$ at a temperature T [K].

When a deep level is present in the depletion layer formed by applying the reverse voltage ($V_R$), a DLTS spectrum such as that shown in FIG. 14 can be obtained by plotting the relation between the DLTS signal $\Delta C$ and the temperature. FIG. 14 is a DLTS spectrum obtained by measuring p-type CZ silicon under two sets of conditions of a measurement frequency e=54.25/s and e=542.5/s. The reason why a spectrum of the form shown in FIG. 14 was obtained is that the speed at which the carriers were released was dependent on temperature as set forth below.

Low temperature: $\Delta C \approx 0$ because the release of carriers from deep levels was slow.

High temperature: The release of carriers from deep levels was rapid, ending completely before t=t1, resulting in $\Delta C \approx 0$.

Due to the above relation, there is dependence on the characteristics of deep levels (activation energy Ea, carrier capture cross-section area $\sigma$) and on the measurement conditions, and a peak in $\Delta C$ occurs at a prescribed temperature. In FIG. 14, since data processing was conducted according to Equation (1), the peak is downward (downwardly convex). There is also data processing in which $\Delta C = C(t2) - C(t1)$. In that case, the signal based on the deep level will be upwardly convex.

From the height of the peak in the DLTS spectrum thus obtained, the concentration ($N_T$) of the deep level can be calculated from Equation (2) below, for example:

$$N_T \approx 2 * N_D * \Delta C_{MAX}/C_\infty (/\text{cm}^3) \qquad (2)$$

In the above equation, $N_D$ denotes the dopant concentration, $\Delta C_{MAX}$ denotes the intensity of the DLTS signal at the peak position temperature, and $C_\infty$ denotes the capacitance of the depletion layer once the release of carriers from deep levels has nearly ended following application of $V_R$. Accordingly, one obtains $C_\infty = C(V=V_R, t=\infty)$.

When DLTS measurement is conducted while varying the ratio of $t_1/t_2$, the DLTS peak position shifts correspondingly.

When that happens, it becomes possible to calculate the emission rate e of carriers from Equations (3) and (4) below based on measurement conditions t1 and t2.

$$\tau = (t_2 - t_1)/\log(t_2/t_1) \qquad (3)$$

$$e = 1/\tau \qquad (4)$$

By plotting the inverse 1/T of the peak position (temperature) T on the X axis and plotting $e/T^2$ on the Y axis in a so-called Arrhenius plot, it is possible to obtain the energy level ($E_T$) of the deep level from the slope (y-intercept) of the plot. That is because the relation of Equation (5) below exists between the various characteristic values:

$$\ln(e/T^2) = \ln(\gamma\sigma) \cdot E_{act}/kT \qquad (5)$$

In the above equation, k denotes the Boltzmann constant, and γ and $E_{act}$ are as set forth below. In the case of an n-type substrate (in which the majority carriers are electrons):

$$\gamma = 1.9E20 \, [cm^{-2}s^{-1}K^{-2}]$$

$$E_{act} = E_c - E_T \, [eV]$$

In the case of a p-type substrate (in which the majority carriers are holes):

$$\gamma = 1.8E21 \, [cm^{-2}s^{-1}K^{-2}]$$

$$E_{act} = E_c - E_V \, [eV]$$

(In the above, $E_C$ denotes the lower edge of the conduction band and $E_V$ denotes the upper edge of the valence band.)

The identity (type of contaminating metal) of the deep level detected by these measurements can be specified by comparison with libraries of Arrhenius plots based on the measurement results of DLTS given in the past reference and literature, and libraries of Arrhenius plots individually prepared by collecting the measurement results of DLTS of semiconductor substrates into which defects and metal contaminants have been intentionally introduced. For example, in FIG. 14, in the two sets of conditions of measurement frequencies of e=54.25/s and e=542.5/s, DLTS signal peaks were detected at positions of 52 k and 60 k, respectively. FIG. 15 is the result of preparing an Arrhenius plot of the relation between e and the peak position (temperature) obtained in the measurement of FIG. 14 and comparing it to a library built into the measurement apparatus. From FIG. 15, it will be understood that there is a high possibility of the DLTS signal detected in FIG. 14 being due to the pair Fe—B. Based on these results, it is possible to specify the contaminating metal as Fe.

As shown in FIG. 15, when a large quantity of contaminant metal is contained in a semiconductor substrate, the DLTS signal from the deep level will be quite large, and compared to it, the effect of the baseline slope or undulation will be quite small and can be ignored, making it easy to detect the peak. However, as the performance of semiconductor devices has improved in recent years, the cleaning (the reduction of the concentration of metal impurities) of semiconductor substrates such as silicon wafers has progressed. Thus, there is a need for even greater sensitivity to evaluate trace quantities of metal impurities by the DLTS method. However, in clean semiconductor substrates, the quantity of metal impurities causing the formation of deep levels is small, rendering the DLTS signal extremely weak. In such cases, the magnitude of baseline slope and undulation components unrelated to the emission of carriers by deep levels is large, that is not negligible relative to the intensity of the actual DLTS signal due to deep levels, hindering detection of the position and height of peaks with good precision. When baseline undulation or the like is present, in addition to a high level of so-called white noise, it impedes identification of the signal (peak). As a countermeasure to these baseline slopes and undulations, there exists the method of analysis of simply connecting the two shoulders of the signals due to deep levels with a straight line and using this straight line as a baseline. However, when multiple peaks appear in overlapping fashion (or the possibility of their appearing in this manner exists), the procedure of simply connecting the two shoulders of the peaks with a line is of doubtful reliability. There are also cases in which the baseline contains undulation that does not lend itself to approximation with a simple straight line. Thus, this method presents the risk of considerable error.

There is a need to achieve further sensitivity in the evaluation of metal contamination in semiconductor substrates by the DLTS method, as set forth above.

SUMMARY OF THE INVENTION

An aspect of the present invention provides for a means of evaluating the metal contamination in a semiconductor substrate by the DLTS method with greater sensitivity.

An aspect of the present invention relates to:

a method of evaluating metal contamination in a semiconductor sample by DLTS method, which comprises:

obtaining a first DLTS spectrum by measuring a DLTS signal while varying a temperature, the DLTS signal being generated by alternatively and cyclically applying to a semiconductor junction formed on a semiconductor sample to be evaluated a reverse voltage $V_R$ to form a depletion layer and a weak voltage $V_1$ to trap carriers in the depletion layer;

obtaining a second DLTS spectrum by measuring a DLTS signal while varying a temperature, the DLTS signal being generated by cyclically applying the $V_R$ to the semiconductor junction;

obtaining a differential spectrum of the first DLTS spectrum with a correction-use spectrum in the form of the second DLTS spectrum or a spectrum that is obtained by approximating the second DLTS spectrum as a straight line or as a curve; and conducting evaluation of metal contamination in the semiconductor sample with the use of the differential spectrum as a DLTS spectrum for the evaluation.

The evaluation of metal contamination can include identification of a type of contaminating metal based on a peak position on the DLTS spectrum for the evaluation.

The correction-use spectrum can be an approximate curve of the second DLTS curve.

The first DLTS spectrum and the second DLTS spectrum can be obtained in a single temperature sweep by alternatively conducting, with a temperature sweep, measurement of DLTS signal for obtaining the first DLTS spectrum and measurement of DLTS signal for obtaining the second DLTS spectrum on the semiconductor junction.

A further aspect of the present invention relates to:

a method of manufacturing a semiconductor substrate, which comprises the steps of:

preparing a lot of semiconductor substrates consisting of a plurality of semiconductor substrates;

choosing at least one semiconductor substrate from the lot;

evaluating metal contamination of the semiconductor substrate that has been chosen;

shipping product substrates in the form of the other semiconductor substrates in the same lot as a semiconductor substrate that has been determined to have equal to or lower than a permitted level of metal contamination as a result of the evaluation, and conducting the evaluation of metal contamination of the semiconductor substrate that has been chosen by the method of evaluating metal contamination set forth above.

In the conventional DLTS method, the slope and undulation of the baseline that are not due to the trapping and emission of carriers by deep levels are included in the measurement results, causing errors in the quantification results of the energy level of deep levels (ET), the capture cross-section area of carriers (σ), and the level density (NT). By contrast, the present invention makes it possible to obtain more correct measurement results by correcting the slope and undulation of the baseline. The present invention is particularly effective when the DLTS signal of deep levels is extremely weak and the error caused by the slope and undulation of the baseline are non-negligible. Further, application of the present invention to cases where a weak DLTS signal ends up being buried in the slope and undulation of the baseline and in short-cycle noise (so-called white noise) makes it possible to enhance the deep level detection sensitivity of the DLTS method.

MODES FOR CARRYING OUT THE INVENTION

Figure 1:
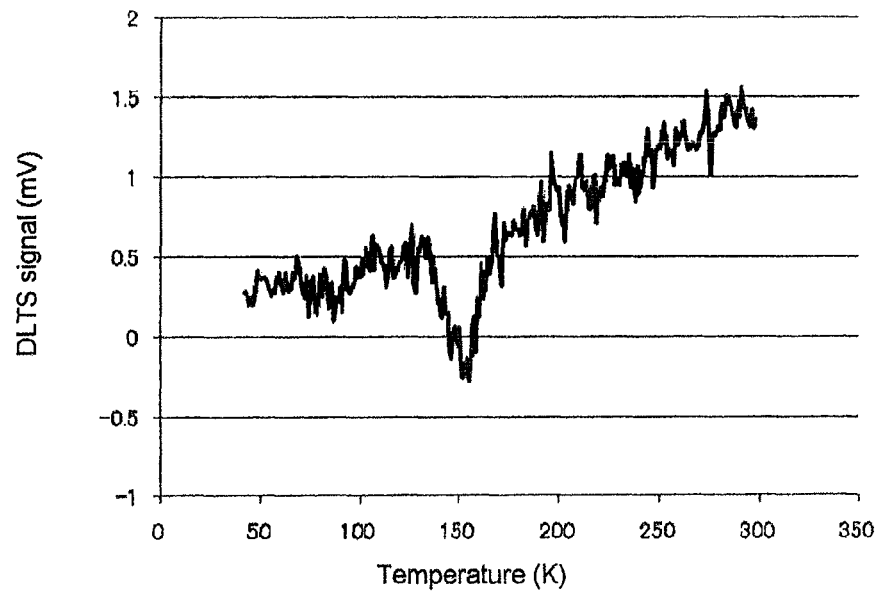
FIG. 1 is a first DLTS spectrum obtained in Example 1.

The present invention relates to a method of evaluating metal contamination in a semiconductor sample by the DLTS method (also referred to as the "evaluation method of the present invention", hereinafter). The evaluation method of the present invention comprises:

obtaining a first DLTS spectrum by measuring a DLTS signal while varying a temperature, the DLTS signal being generated by alternatively and cyclically applying to a semiconductor junction formed on a semiconductor sample to be evaluated a reverse voltage $V_R$ to form a depletion layer and a weak voltage $V_1$ to trap carriers in the depletion layer;

obtaining a second DLTS spectrum by measuring a DLTS signal while varying a temperature, the DLTS signal being generated by cyclically applying the $V_R$ to the semiconductor junction;

obtaining a differential spectrum of the first DLTS spectrum with a correction-use spectrum in the form of the second DLTS spectrum or a spectrum that is obtained by approximating the second DLTS spectrum as a straight line or as a curve; and conducting evaluation of metal contamination in the semiconductor sample with the use of the differential spectrum as a DLTS spectrum for the evaluation.

A voltage that is applied to a semiconductor junction so that current flows in a p-type→n-type direction is referred to as a forward voltage and a voltage applied in the opposite direction is referred to as a reverse voltage. As is widely known in this field, when a reverse voltage is applied, a current does not flow through the semiconductor junction, so a depletion layer forms at the semiconductor junction. When obtaining the first DLTS spectrum, the application of $V_1$ being close to 0 V causes carriers to be trapped by the depletion layer formed by the application of $V_R$. This is similar to usual DLTS measurement. However, in the present invention, $V_1$ is not applied when obtaining the second DLTS spectrum, so carriers are neither trapped nor released by deep levels in the depletion layer that widens when $V_R$ is applied. Accordingly, the second DLTS spectrum contains only the baseline slope and undulation and short-cycle noise (so-called white noise) that are produced irrespective of the trapping and emission of carriers by deep levels. Accordingly, the differential spectrum of the first DLTS spectrum with the correction-use spectrum obtained from the second DLTS spectrum contains only the signal based on the trapping and emission of carriers by deep levels. Thus, the above differential spectrum can be employed as an evaluation-use DLTS spectrum to correctly obtain the intensity of deep level signals and the position of signal peaks. Accordingly, greater sensitivity can be achieved by the DLTS method.

The evaluation method of the present invention will be described below in greater detail.

Various semiconductor substrates (such as silicon wafers) to which the DLTS method is usually applied are examples of semiconductor samples that can be evaluated in the present invention. The usual DLTS measurement apparatus can be employed as is, or modified in some manner, as the measurement apparatus that is employed to measure DLTS signals and generate DLTS spectra. For example, the usual DLTS apparatus obtains a single DLTS spectrum for a single temperature sweep. However, in the present invention, it is also possible to employ a measurement apparatus in which the program loaded into the apparatus has been changed to make it possible to obtain both the first DLTS spectrum and the second DLTS spectrum in a single temperature sweep by varying the temperature while conducting in alternating fashion normal DLTS signal measurement and DLTS signal measurement unaccompanied by the application of weak voltage $V_1$. In this manner, the first DLTS spectrum and the second DLTS spectrum can be obtained for a single sample in a single temperature sweep; the first DLTS spectrum can be obtained in a first temperature sweep and the second DLTS spectrum obtained in a second temperature sweep; or the first and second DLTS spectra can be obtained in reverse order.

The first DLTS spectrum can be obtained in the present invention in the same manner as in the conventional DLTS method. The details are as set forth above.

The second DLTS spectrum can be obtained by the same method as in the conventional DLTS method with the exception that, instead of applying $V_R$ and $V_1$ in alternating and cyclical method, the application of $V_R$ is repeated (that is, $V_1$ is made equal to $V_R$). The second DLTS spectrum that is obtained in this method contains only the baseline slope and undulation and short-cycle noise (so-called white noise) that are produced irrespective of the trapping and emission of carriers by deep levels, as set forth above. This second DLTS spectrum can also be employed as is as a correction-use spectrum. However, both the first DLTS spectrum and the second DLTS spectrum contain short-cycle noise (so-called white noise). Accordingly, when the difference is taken from the spectra obtained, the white noise in the differential spectrum is large. Thus, it is desirable to employ an approximate straight line or an approximate curve as a correction-use spectrum for obtaining a differential spectrum. The approximate straight line and an approximate curve will be described further in Examples set forth farther below.

In the present invention, the second DLTS spectrum or a spectrum obtained by approximating the second DLTS spectrum as a straight line or curve is employed as a correction-use spectrum, and a differential spectrum is obtained from the correction-use spectrum and the first DLTS spectrum. The differential spectrum can be readily and automatically obtained by incorporating a suitable program into the data analyzing element of a DLTS measurement apparatus.

As set forth above, the effects of the baseline slope and undulation components and short-cycle noise (so-called white noise) that are unrelated to the emission of carriers by deep levels are eliminated or reduced in the differential spectrum thus obtained; it contains only the signal due to the trapping and emission of carriers by deep levels. Accordingly, employing the differential spectrum as an evaluation-use DLTS spectrum makes it possible to correctly determine the intensity of signals from deep levels and the positions of signal peaks, and makes it possible to greatly enhance the reliability of metal contaminant evaluation by the DLTS method. The various evaluations of metal contaminants using DLTS spectra can be conducted in the same manner as with the usual DLTS method; the details are as set forth above.

The present invention further relates to a method of manufacturing a semiconductor substrate (also referred to as the "manufacturing method of the present invention", hereinafter) comprising the steps of: preparing a lot of semiconductor substrates consisting of a plurality of semiconductor substrates; choosing at least one semiconductor substrate from the lot; evaluating metal contamination of the semiconductor substrate that has been chosen; shipping product substrates in the form of the other semiconductor substrates in the same lot as a semiconductor substrate that has been determined to have equal to or lower than a permitted level of metal contamination as a result of the evaluation. In the manufacturing method of the present invention, the evaluation of metal contamination of the semiconductor substrate that has been chosen is conducted by the evaluation method of the present invention.

As set forth above, the metal contamination in a semiconductor substrate such as a silicon wafer can be measured with high sensitivity, even in clean substrates with trace quantities of contaminants, by the evaluation method of the present invention. Thus, it is possible to reliably provide high-quality product substrates by shipping product substrates in the form of semiconductor substrates that have been determined by the above evaluation method to contain equal to or lower than permissible level of metal contaminants, for example, semiconductor substrates in the same lot as a non-defective semiconductor substrate that has been determined not to have been contaminated by specific metals, or to contain only small quantities of contaminants. The standard (the permissible level of metal contamination) for determining non-defective products can be set by taking into account the properties required of the substrate based on the application or the like of the substrate. The number of substrates per lot and the number of substrates chosen need only be suitably set.

EXAMPLES

The present invention will be further described below based on Examples. However, the present invention is not limited to the embodiments shown in Examples.

Example 1

1) First Step

Obtaining the First DLTS Spectrum

A 1 mm$^2$ Au electrode was formed on an n-type silicon substrate with a resistivity of 10 Ω·cm and employed as a Schottky diode. Ga was applied by pasting on the other surface of the substrate, the substrate was placed on a sample platform, and the sample platform was employed as a counter-electrode. A lock-In type DLTS apparatus was employed in this process.

A $V_R$ of −3 V and a $V_1$ of −1 V were employed. The DLTS signal was measured while varying the temperature over a temperature range of about 30 K to about 300 K at a measurement frequency of 25 Hz (e=54.25/s), and a DLTS spectrum was obtained using a program built into the apparatus. The DLTS spectrum obtained (the first DLTS spectrum) is given in FIG. 1. As indicated in FIG. 1, the DLTS signal of some level of impurity was detected over the temperature range of 150 to 200 K. However, because the baseline slope was large, it was difficult to specifically identify the peaks.

2) Second Step

Obtaining the Second DLTS Spectrum

Figure 2:
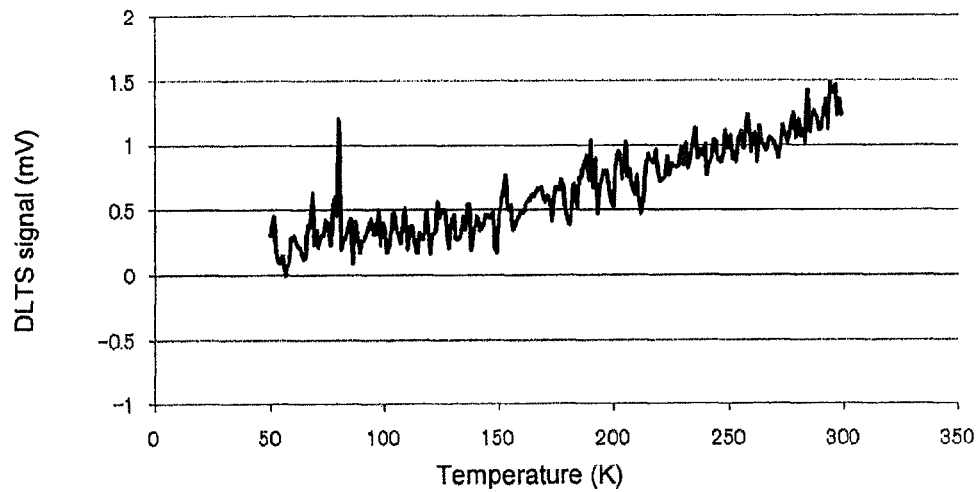
FIG. 2 is a second DLTS spectrum obtained in Example 1.

A DLTS spectrum was obtained by the same method as in 1) for the same sample employed in 1) with the exception that $V_R = V_1 = -3$ V. The DLTS spectrum obtained (the second DLTS spectrum) is shown in FIG. 2. The transient response of the capacitance, unrelated to the emission of carriers, has been captured in the DLTS spectrum shown in FIG. 2. Although the spectrum is close to being a straight line, it is strictly speaking not a straight line, and will be seen to be a curve that meanders somewhat.

3) Preparing a Correction-Use Spectrum

Figure 3:
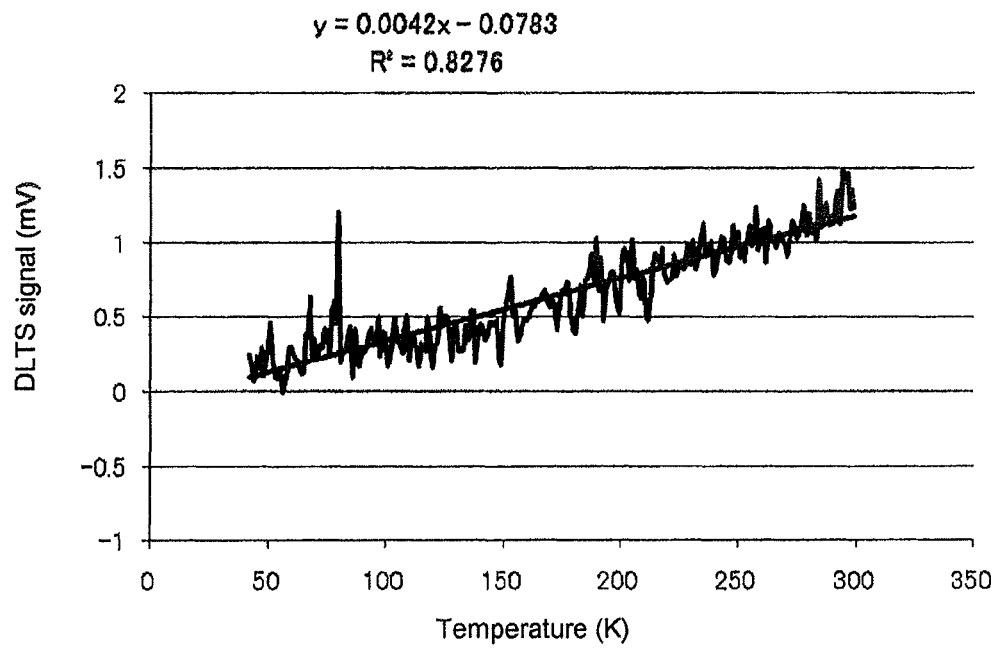
FIG. 3 shows an approximate straight line obtained by approximating the second DLTS spectrum shown in FIG. 2 with a straight line.
Figure 4:
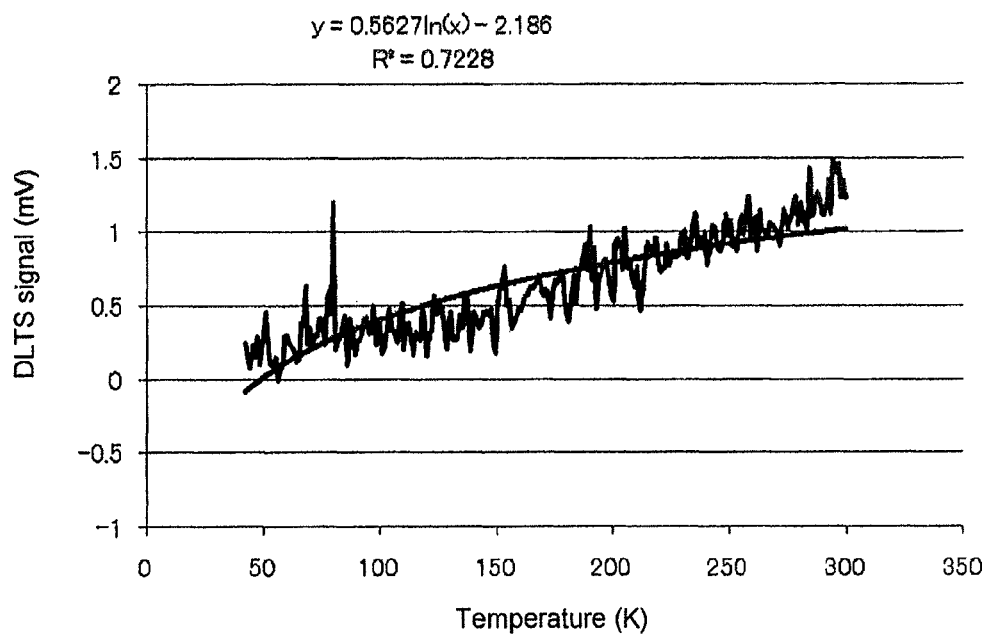
FIG. 4 shows an approximate curve obtained by approximating the second DLTS spectrum shown in FIG. 2 with a logarithmic function.
Figure 5:
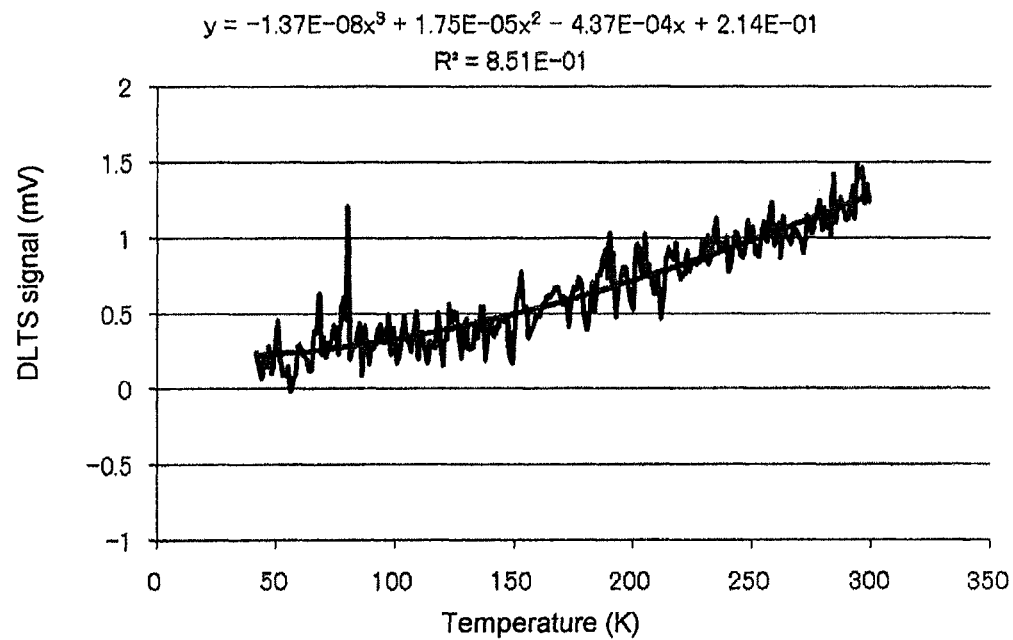
FIG. 5 shows an approximate curve obtained by approximating the second DLTS spectrum shown in FIG. 2 with a third-order polynomial.
Figure 6:
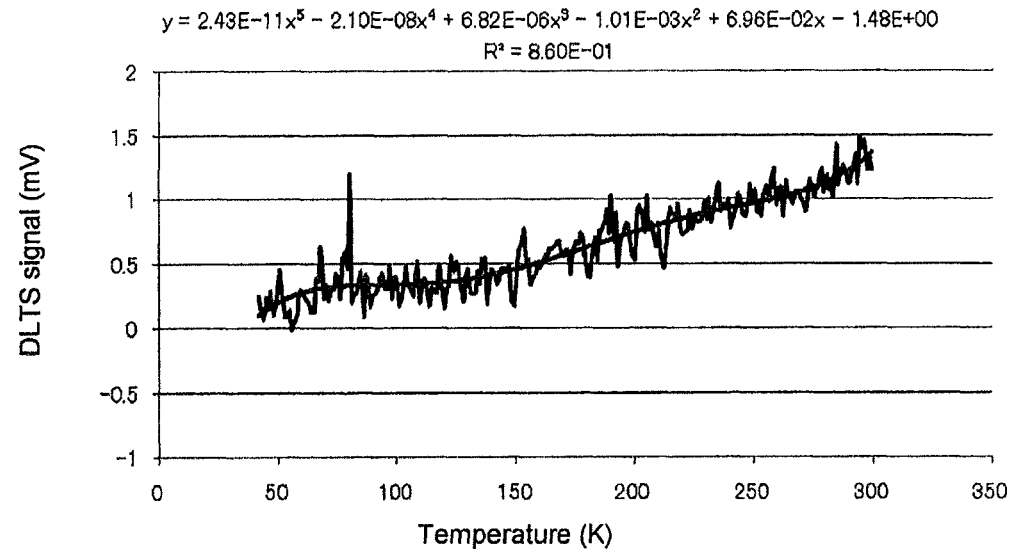
FIG. 6 shows an approximate curve obtained by approximating the second DLTS spectrum shown in FIG. 2 with a fifth-order polynomial.
Figure 7:
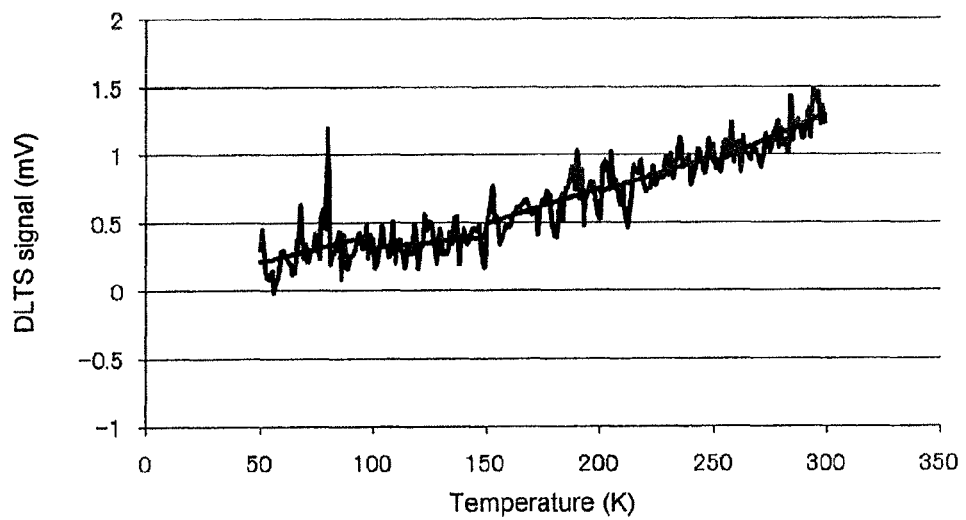
FIG. 7 shows the results of dividing the second DLTS spectrum shown in FIG. 2 into intervals of 50 K each, approximating lines, and connecting the approximated straight lines obtained.

The straight line shown in FIG. 3 is an approximate straight line obtained by approximating the DLTS spectrum shown in FIG. 2 with a straight line. FIGS. 4, 5, and 6 show approximate curves obtained by approximating the same spectrum with a logarithmic function, a third-order polynomial, and a fifth-order polynomial, respectively. In the straight line (FIG. 3) and logarithmic function (FIG. 4), there are discrepancies between the DLTS spectrum and the approximate line (curve). It is also possible to use the straight line and the curve as a correction-use spectrum to obtain a differential spectrum. However, due to the spots of discrepancy mentioned above, there would be cases where a pseudo signal appeared on the differential spectrum. Taking this point into consideration, the use of an approximate curve with a correlation coefficient $R^2$, of equal to or greater than 0.85, as the correction-use spectrum is desirable to enhance the precision and reliability of evaluation. Further, the present invention is not limited to the use of a single approximate straight line or curve. The temperature range can be partitioned into several intervals, each temperature interval can be approximated with a line, and the approximate straight lines obtained can be connected to obtain a correction-use spectrum. FIG. 7 shows a correction-use spectrum obtained by partitioning into 50 K intervals, approximating each with a line, and connecting the approximate straight lines.

4) Preparing a Differential Spectrum

Figure 8:
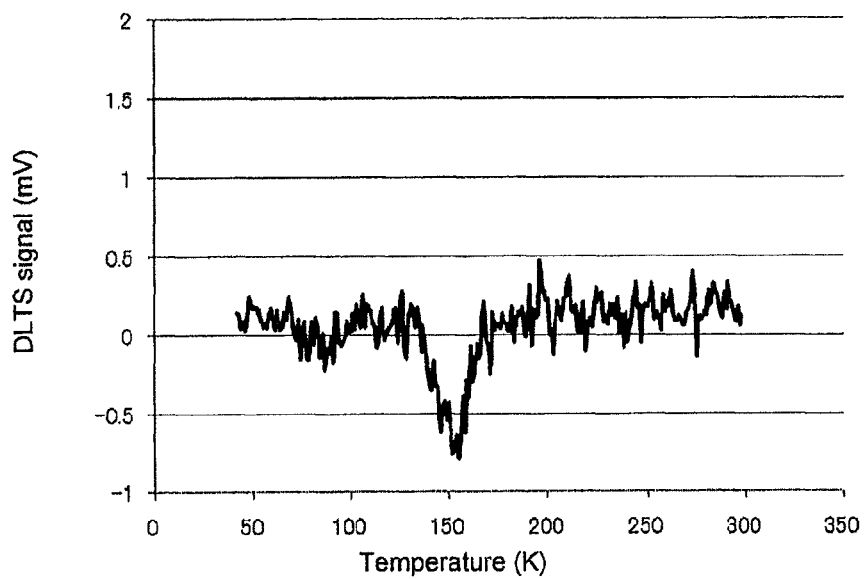
FIG. 8 is a differential spectrum of the first DLTS spectrum of FIG. 1 with the approximate curve shown in FIG. 6.

The approximate curve show in FIG. 6 that was obtained by regression of a fifth-order polynomial was selected as a correction-use spectrum from among the correction spectra prepared in 3) above. A differential spectrum of the first DLTS spectrum shown in FIG. 1 with this correction-use spectrum was prepared. FIG. 8 shows the differential spectrum obtained.

When the temperatures at which downward peaks appeared in the first DLTS spectrum shown in FIG. 1 and the differential spectrum shown in FIG. 8 were read, the position of the peak in the first DLTS spectrum was 151 K and the peak position in the differential spectrum was 153 K. The reason for such a 2 K displacement was as follows. In the first DLTS spectrum, the baseline slope was upward and to the right, so the position of the peak ended up shifting to the low temperature side. When such a shifting of peaks occurs, the Arrhenius plot as a whole ends up shifting to the low temperature side. Thus, it constitutes an obstacle in making comparisons with a library prepared by collecting past literature or the like to infer the causes of the formation of deep levels. By contrast, the shift in the position of the peak caused by the shape of the baseline is corrected in the differential spectrum shown in FIG. 8, so reliability in presuming the causes of the formation of deep levels is increased.

The deep level of the peak specified at 153 K in FIG. 8 was presumed to be due to contamination of the silicon by Ti. The details will be described in Example 2 below. Peaks in the vicinity of 80 K can be confirmed by both the first DLTS spectrum shown in FIG. 1 and in the differential spectrum shown in FIG. 8. However, it is asymmetrically affected in FIG. 1, making it difficult to determine the position (temperature) of the shoulders, top, and the like of the peak. By contrast, in the differential spectrum shown in FIG. 8, it is possible to clearly determine a signal caused by a deep level with 85 K as the top and widening by about 10 K on either side.

Example 2

Figure 9:
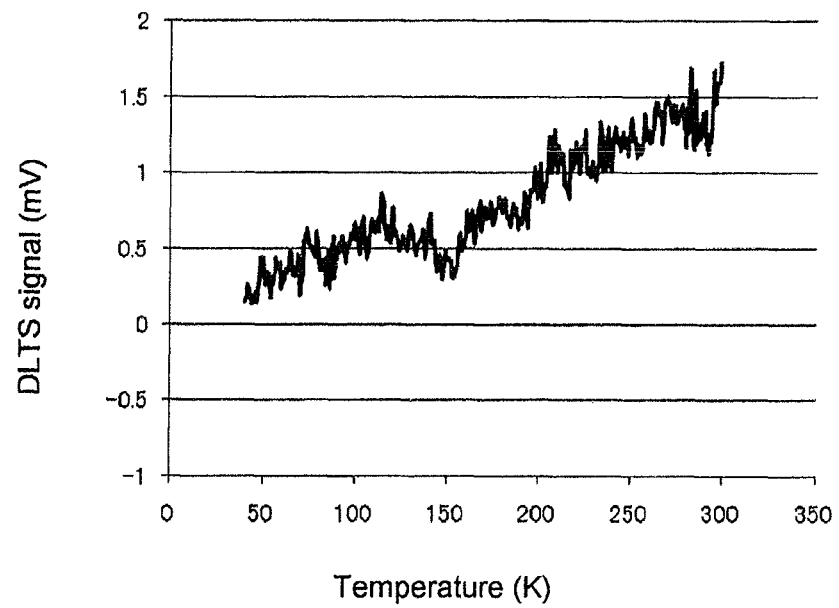
FIG. 9 is a first DLTS spectrum obtained in Example 2.
Figure 10:
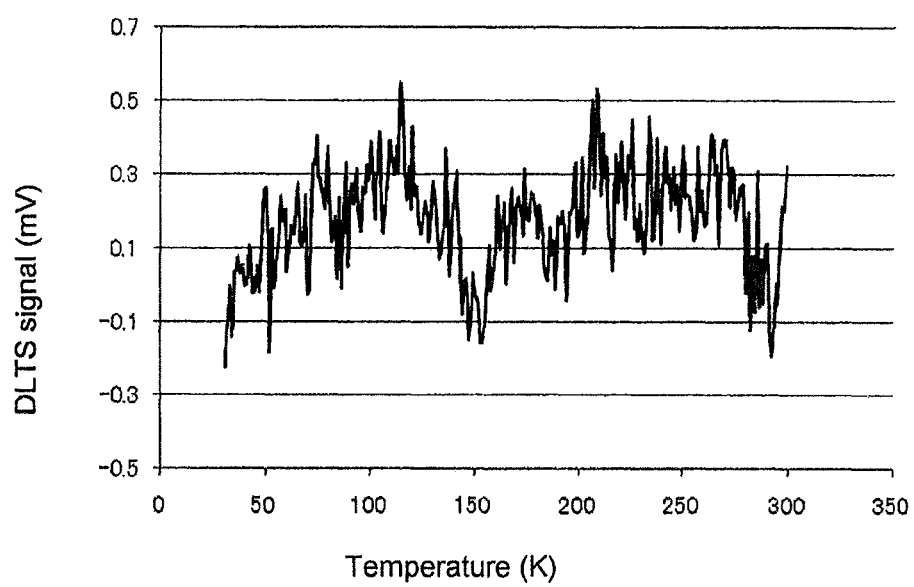
FIG. 10 is a differential spectrum of the first DLTS spectrum shown in FIG. 9 with the approximate curve obtained by approximating the second DLTS spectrum obtained in Example 2 as a fourth-order polynomial.

A 1 mm$^2$ Au Schottky diode different from that employed in Example 1 was formed on an n-type silicon substrate with a resistivity of 10 Ω·cm and analysis and measurement were conducted under the same conditions as in Example 1. FIG. 9 is a first DLTS spectrum. FIG. 10 is a differential spectrum obtained using an approximate curve obtained by regressing a second DLTS spectrum to a fourth-order polynomial as a correction-use spectrum.

Figure 11:
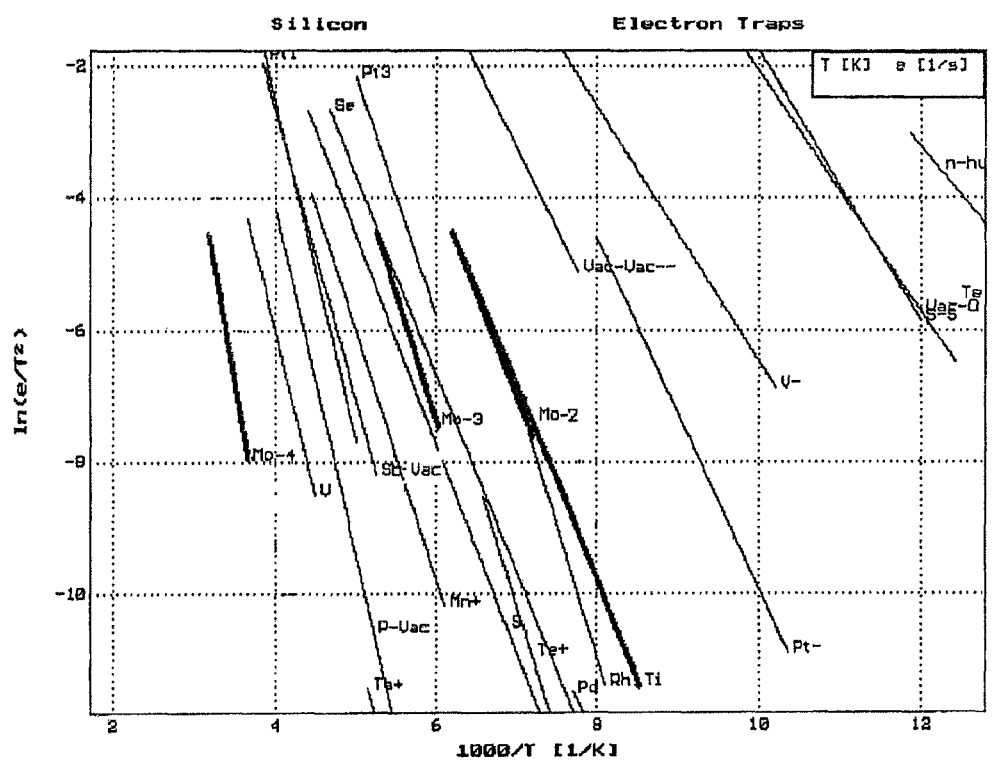
FIG. 11 shows a library of deep levels detected by DLTS as electron traps in n-type silicon.
Figure 12:
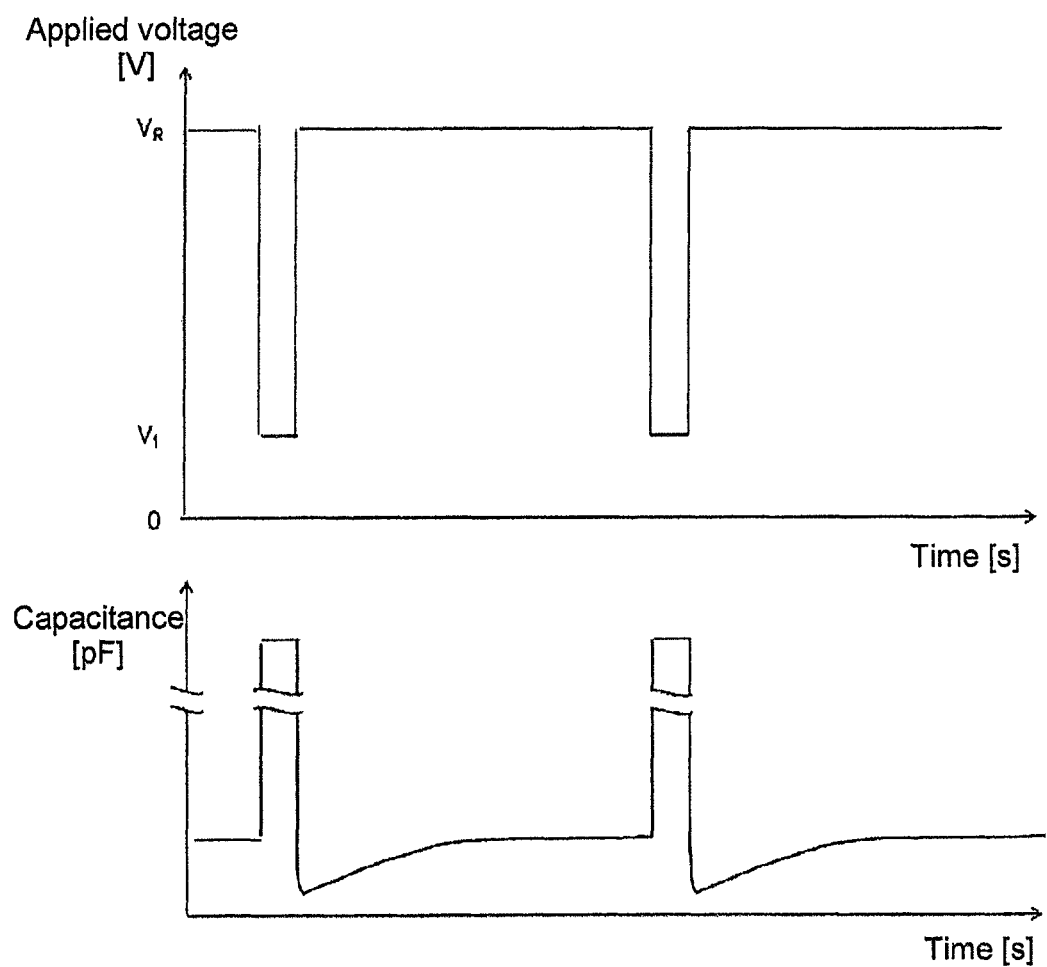
FIG. 12 is a descriptive drawing of the conventional DLTS method.
Figure 13:
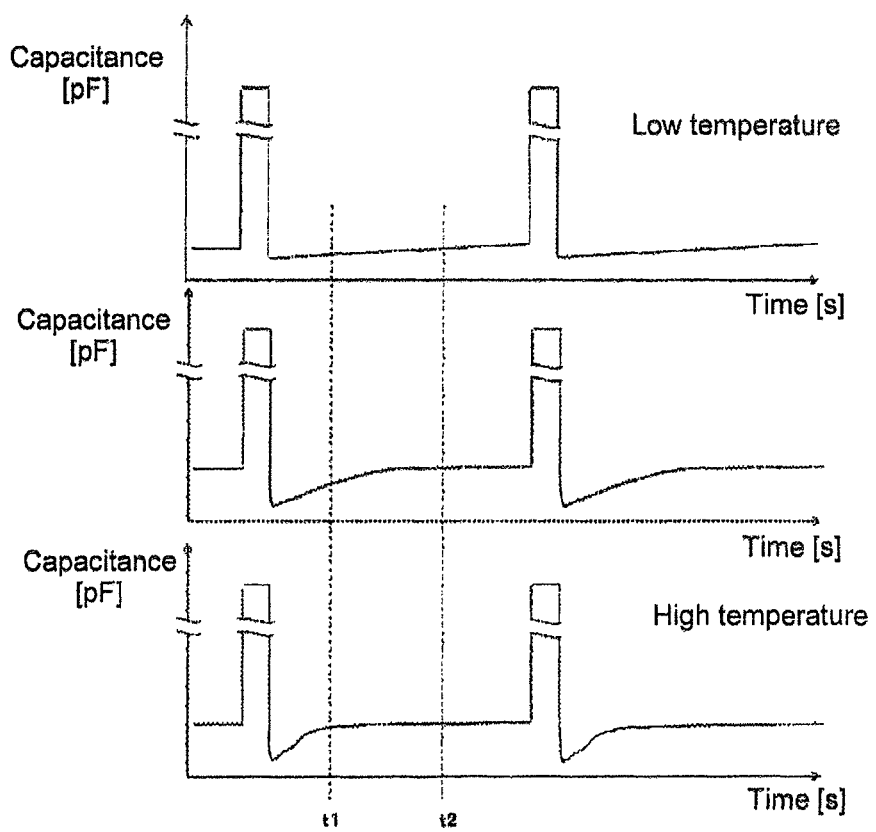
FIG. 13 is a descriptive drawing of the conventional DLTS method.
Figure 14:
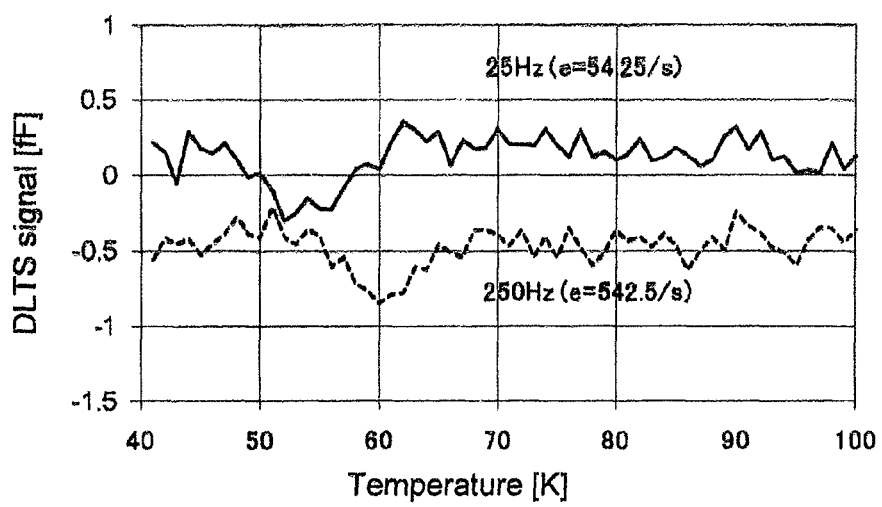
FIG. 14 is a descriptive drawing of the conventional DLTS method.
Figure 15:
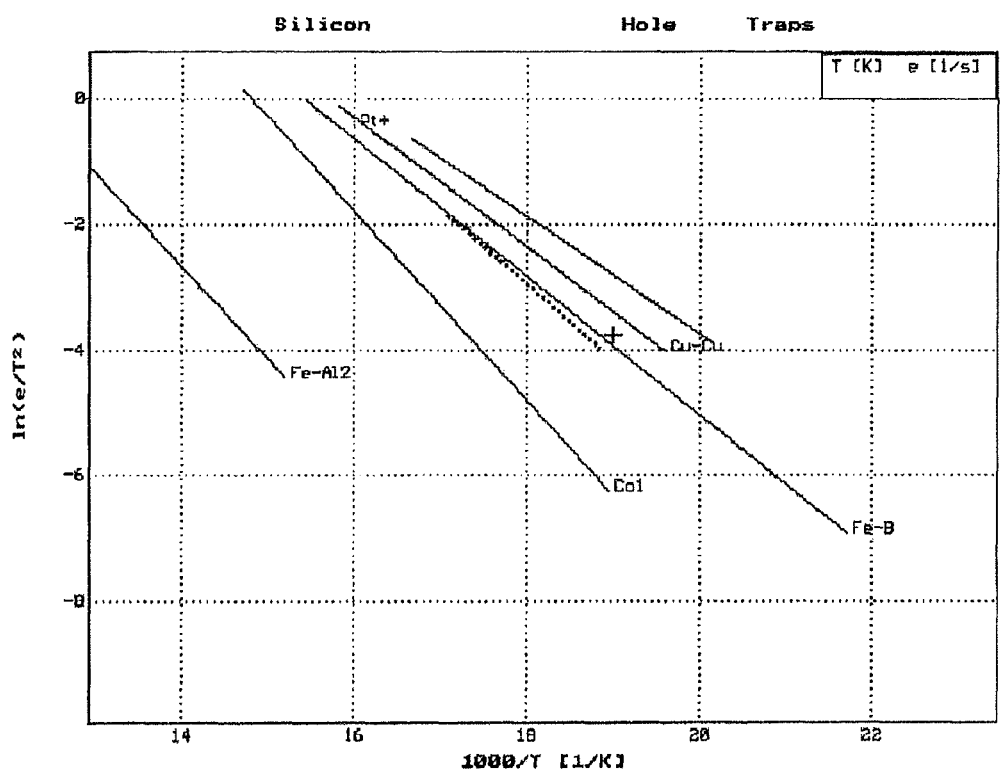
FIG. 15 is a descriptive drawing of the conventional DLTS method.

FIG. 11 shows a library (values from the literature) of deep levels detected by DLTS as electron traps in n-type silicon. As shown in this library, when attention is paid to just signals appearing in the vicinity of 150 K, one cannot tell if they are due to Ti or Mo-2, that is, one cannot tell if the contaminant metal species is Ti or Mo. In such cases, it suffices to note whether Mo-3 or Mo-4 is detected in conjunction with the appearance of Mo-2. However, since the signal of Mo-3 and Mo-4 is extremely weak and less intense than the signal of Mo-2, it is highly possible that it would end up being buried in the baseline noise and go undetected. Actually, a peak (E1, hereinafter) can be identified in the vicinity of 150 K in FIG. 9, but due to the effects of baseline noise and the like, it is difficult to identify any other signals.

By contrast, the presence of extremely weak peaks in the vicinity of 190 K (E2, hereinafter) to the immediate side of the signal in the vicinity of 150 K and in the vicinity of 270 K (E3, hereinafter) can be identified in the differential spectrum shown in FIG. 10. It is known that such a group of three peaks appears when DLTS detection of Mo-doped n-type silicon is conducted (see T. Hamaouchi and Y. Hayamizu, Japanese Journal of Applied Physics, vol. 30, No. 11A, L1837-L1839, 1991). Accordingly, only by using the differential spectrum shown in FIG. 10 does it become possible to infer that the silicon wafer evaluated in Example 2 was contaminated with a trace quantity of Mo.

In the case of Ti contamination, as well, a signal is known to occur in the vicinity of 150 K. When just a signal in the vicinity of 150 K is noted, it is extremely difficult to distinguish whether it is a deep level due to Ti or the E1 of Mo. That is, since no signal in addition to E1 can be identified in the first DLTS spectrum shown in FIG. 9, it is difficult to differentiate between Ti contamination and Mo contamination. By contrast, as set forth above, by paying attention to the two signals E2 and E3 in addition to the signal in the vicinity of 150 K, it becomes possible to determine Mo if both E2 and E3 are detected and to determine Ti if they are not detected. In Example 1 above, the signal detected at 153 K in the differential spectrum, despite being of greater intensity than E1 in Example 2, is not accompanied by signals corresponding to E2 and E3 of Mo, making it highly likely that it is a deep level due to Ti, not Mo.

As set forth above, by correcting the baseline slope, undulation, and the like in the present invention, it becomes possible to detect even extremely weak signals without overlooking them. As a result, it is possible to increase the reliability of identification of the causes (metal contamination) of deep levels.

The present invention is useful in quality or process control in the field of manufacturing semiconductor substrates.

The invention claimed is:

1. A method of evaluating metal contamination in a semiconductor sample by DLTS method, which comprises:
   obtaining a first DLTS spectrum by measuring a DLTS signal while varying a temperature, the DLTS signal being generated by alternatively and cyclically applying to a semiconductor junction formed on a semiconductor sample to be evaluated a reverse voltage $V_R$ to form a depletion layer and a weak voltage $V_1$ to trap carriers in the depletion layer;
   obtaining a second DLTS spectrum by measuring a DLTS signal while varying a temperature, the DLTS signal being generated by cyclically applying the $V_R$ to the semiconductor junction;
   obtaining a differential spectrum of the first DLTS spectrum with a correction-use spectrum in the form of the second DLTS spectrum or a spectrum that is obtained by approximating the second DLTS spectrum as a straight line or as a curve; and
   conducting evaluation of metal contamination in the semiconductor sample with the use of the differential spectrum as a DLTS spectrum for the evaluation.

2. The method of evaluating metal contamination according to claim 1, wherein the evaluation of metal contamination comprises identification of a type of contaminating metal based on a peak position on the DLTS spectrum for the evaluation.

3. The method of evaluating metal contamination according to claim 2, wherein the correction-use spectrum is an approximate curve of the second DLTS curve.

4. The method of evaluating metal contamination according to claim 3, wherein the first DLTS spectrum and the second DLTS spectrum are obtained in a single temperature sweep by alternatively conducting, with a temperature sweep, measurement of DLTS signal for obtaining the first DLTS spectrum and measurement of DLTS signal for obtaining the second DLTS spectrum on the semiconductor junction.

5. The method of evaluating metal contamination according to claim 2, wherein the first DLTS spectrum and the second DLTS spectrum are obtained in a single temperature sweep by alternatively conducting, with a temperature sweep, measurement of DLTS signal for obtaining the first DLTS spectrum and measurement of DLTS signal for obtaining the second DLTS spectrum on the semiconductor junction.

6. The method of evaluating metal contamination according to claim 1, wherein the correction-use spectrum is an approximate curve of the second DLTS curve.

7. The method of evaluating metal contamination according to claim 6, wherein the first DLTS spectrum and the second DLTS spectrum are obtained in a single temperature sweep by alternatively conducting, with a temperature sweep, measurement of DLTS signal for obtaining the first DLTS spectrum and measurement of DLTS signal for obtaining the second DLTS spectrum on the semiconductor junction.

8. The method of evaluating metal contamination according to claim 1, wherein the first DLTS spectrum and the second DLTS spectrum are obtained in a single temperature sweep by alternatively conducting, with a temperature sweep, measurement of DLTS signal for obtaining the first DLTS spectrum and measurement of DLTS signal for obtaining the second DLTS spectrum on the semiconductor junction.

9. The method of evaluating metal contamination according to claim 1, wherein during the second DLTS, the voltage V1 is not applied.

10. A method of manufacturing a semiconductor substrate, which comprises:
preparing a lot of semiconductor substrates consisting of a plurality of semiconductor substrates;
choosing at least one semiconductor substrate from the lot;
evaluating metal contamination of the semiconductor substrate that has been chosen;
shipping product substrates in the form of the other semiconductor substrates in the same lot as a semiconductor substrate that has been determined to have equal to or lower than a permitted level of metal contamination as a result of the evaluation, and
conducting the evaluation of metal contamination of the semiconductor substrate that has been chosen by a method of evaluating metal contamination in a semiconductor sample by DLTS method, comprising:
obtaining a first DLTS spectrum by measuring a DLTS signal while varying a temperature, the DLTS signal being generated by alternatively and cyclically applying to a semiconductor junction formed on a semiconductor sample to be evaluated a reverse voltage $V_R$ to form a depletion layer and a weak voltage $V_1$ to trap carriers in the depletion layer;
obtaining a second DLTS spectrum by measuring a DLTS signal while varying a temperature, the DLTS signal being generated by cyclically applying the $V_R$ to the semiconductor junction;
obtaining a differential spectrum of the first DLTS spectrum with a correction-use spectrum in the form of the second DLTS spectrum or a spectrum that is obtained by approximating the second DLTS spectrum as a straight line or as a curve; and
conducting evaluation of metal contamination in the semiconductor sample with the use of the differential spectrum as a DLTS spectrum for the evaluation.

11. The method of manufacturing a semiconductor substrate according to claim 10, wherein the method of evaluating metal contamination comprises identification of a type of contaminating metal based on a peak position on the DLTS spectrum for the evaluation.

12. The method of manufacturing a semiconductor substrate according to claim 11, wherein the correction-use spectrum is an approximate curve of the second DLTS curve.

13. The method of manufacturing a semiconductor substrate according to claim 12 wherein the first DLTS spectrum and the second DLTS spectrum are obtained in a single temperature sweep by alternatively conducting, with a temperature sweep, measurement of DLTS signal for obtaining the first DLTS spectrum and measurement of DLTS signal for obtaining the second DLTS spectrum on the semiconductor junction.

14. The method of manufacturing a semiconductor substrate according to claim 11 wherein the first DLTS spectrum and the second DLTS spectrum are obtained in a single temperature sweep by alternatively conducting, with a temperature sweep, measurement of DLTS signal for obtaining the first DLTS spectrum and measurement of DLTS signal for obtaining the second DLTS spectrum on the semiconductor junction.

15. The method of manufacturing a semiconductor substrate according to claim 10, wherein the correction-use spectrum is an approximate curve of the second DLTS curve.

16. The method of manufacturing a semiconductor substrate according to claim 15 wherein the first DLTS spectrum and the second DLTS spectrum are obtained in a single temperature sweep by alternatively conducting, with a temperature sweep, measurement of DLTS signal for obtaining the first DLTS spectrum and measurement of DLTS signal for obtaining the second DLTS spectrum on the semiconductor junction.

17. The method of manufacturing a semiconductor substrate according to claim 10, wherein the first DLTS spectrum and the second DLTS spectrum are obtained in a single temperature sweep by alternatively conducting, with a temperature sweep, measurement of DLTS signal for obtaining the first DLTS spectrum and measurement of DLTS signal for obtaining the second DLTS spectrum on the semiconductor junction.

18. The method of manufacturing a semiconductor substrate according to claim 10, wherein during the second DLTS, the voltage V1 is not applied.

\* \* \* \* \*